US012604706B2

(12) United States Patent
Nguyen et al.

(10) Patent No.: US 12,604,706 B2
(45) Date of Patent: Apr. 14, 2026

(54) APPARATUS INCLUDING TRANSPARENT MATERIAL FOR TRANSPARENT PROCESS PERFORMANCE AND METHOD USING THEREOF

(71) Applicant: Intel Corporation, Santa Clara, CA (US)

(72) Inventors: Huynh Hai Phuong Nguyen, Ho Chi Minh City (VN); Huy Hoang Nguyen, Ho Chi Minh City (VN); Le Thach Hoang Nguyen, Ho Chi Minh City (VN)

(73) Assignee: Intel Corporation, Santa Clara, CA (US)

( * ) Notice: Subject to any disclaimer, the term of this patent is extended or adjusted under 35 U.S.C. 154(b) by 803 days.

(21) Appl. No.: 17/669,375

(22) Filed: Feb. 11, 2022

(65) Prior Publication Data

US 2023/0260852 A1 Aug. 17, 2023

(51) Int. Cl.
| | |
|---|---|
| *H01L 21/66* | (2006.01) |
| *G01K 11/06* | (2006.01) |
| *H01L 23/00* | (2006.01) |

(52) U.S. Cl.
CPC .............. *H01L 22/12* (2013.01); *G01K 11/06* (2013.01); *H01L 22/34* (2013.01); *H01L 24/27* (2013.01); *H01L 2224/277* (2013.01)

(58) Field of Classification Search
CPC ............. H01L 2224/01; H01L 2224/27; H01L 2224/277; H01L 2224/2783; H01L 2224/27848; H01L 2224/27849; H01L 24/27; H01L 24/29; H01L 24/32; H01L 24/83
See application file for complete search history.

(56) References Cited

U.S. PATENT DOCUMENTS

2015/0332984 A1* 11/2015 Kawate ................... H01L 21/78
                                                                  252/76
2020/0258792 A1* 8/2020 Oram ...................... H01L 22/12

OTHER PUBLICATIONS

Ding Yong et al., Reliability evaluation and selection of underfill adhesives, 2020, (Year: 2020).*

* cited by examiner

*Primary Examiner* — Julio J Maldonado
*Assistant Examiner* — Stanetta D Isaac
(74) *Attorney, Agent, or Firm* — Viering, Jentschura & Partner mbB

(57) ABSTRACT

An apparatus includes a first glass plate, and an outer layer disposed over the first glass plate. The first glass plate and the outer layer are configured to hold a semiconductor die disposed on the first glass plate, and a solder preform interposed between the semiconductor die and the outer layer. The solder preform is viewable through the first glass plate.

20 Claims, 6 Drawing Sheets

100

200

| |
|---|
| IHS 220 |
| Solder Preform 215 |
| Semiconductor Die 210 |
| Glass Plate 205 |

205

225

210

215

220

200

500

505  Form semiconductor die on glass plate

510  Form solder preform on semiconductor die

515  Solder preform in bad condition?    No

Yes

520  Decrease temperature used to manufacture solder preform

525  Maintain temperature used to manufacture solder preform

APPARATUS INCLUDING TRANSPARENT MATERIAL FOR TRANSPARENT PROCESS PERFORMANCE AND METHOD USING THEREOF

BACKGROUND

A thermal interface material (TIM) is disposed on a semiconductor device and protects the semiconductor device from exceeding an operational temperature limit. The TIM also enables thermal bonding of the semiconductor device to a heat sink or a heat spreader without being an excessive thermal barrier.

Preform is a solder TIM (STIM) that is made of metal, which has relatively high thermal conductivity. However, the preform may be sensitive to temperature. Any overshot temperature can cause the preform to melt, affecting its quality. Because of this, the preform disposed on a semiconductor die may be tested in a buy-off tray process using a confocal scanning acoustic microscopy (CSAM), to verify a temperature that is used in the process. In detail, a CSAM picture of the preform is captured and checked to determine whether the preform is in bad condition, e.g., is melted. If the preform is in bad condition, then the process may be halted for troubleshooting, the temperature may be changed and/or a unit with the melted preform may be replaced with a new unit. Otherwise, the temperature is maintained and the preform disposed on the semiconductor die can be further processed.

However, the buy-off tray process may create problems in high volume manufacturing (HVM). The buy-off tray process consumes a CSAM tool for capturing the CSAM picture, and other tools in a production line that are forced idle to wait for a CSAM result. Further, a relatively large headcount and cost can be needed to operate the CSAM tool.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to an apparatus including transparent material for transparent process performance and a method using thereof.

A present apparatus may include a first glass plate, and an outer layer disposed over the first glass plate. The first glass plate and the outer layer are configured to hold a semiconductor die disposed on the first glass plate, and a solder preform interposed between the semiconductor die and the outer layer. The solder preform is viewable through the first glass plate.

In another aspect, a method pursuant to the present disclosure may include forming a semiconductor die on a first glass plate, and forming a solder preform on the semiconductor die, to form a testing device. The method may further include determining whether the solder preform is melted, based on an input from a user or an image recognition device that visually analyzes the solder preform viewable through the first glass plate, and based on the solder preform being determined to be melted, decreasing a temperature that is used to form the solder preform.

In yet another aspect, a present non-transitory computer-readable storage medium may include instructions, which, if executed by a processor, cause the processor to control a semiconductor fabrication device to form a semiconductor die on a first glass plate, and control the semiconductor fabrication device to form a solder preform on the semiconductor die, to form a testing device. The instructions, which, if executed by the processor, may further cause the processor to determine whether the solder preform is melted, based on an input from a user or an image recognition device that visually analyzes the solder preform viewable through the first glass plate, and based on the solder preform being determined to be melted, decrease a temperature that is used to form the solder preform.

Figure 1A:
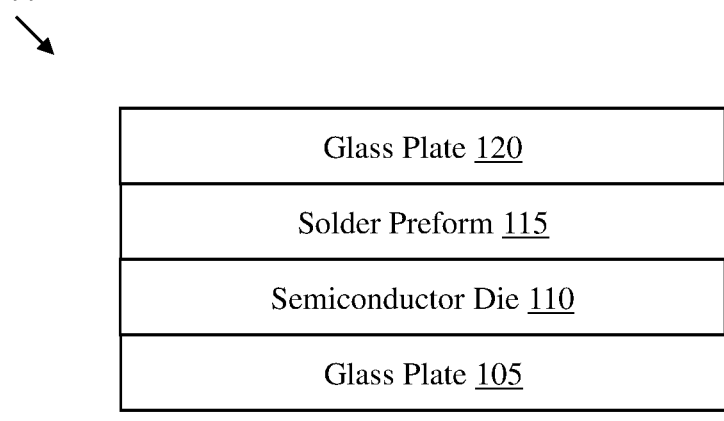
FIG. 1A is a cross-sectional view of an apparatus including transparent material for transparent process performance, according to aspects of the present disclosure.

FIG. 1A is a cross-sectional view of an apparatus 100 including transparent material for transparent process performance, according to aspects of the present disclosure.

Referring to FIG. 1A, the apparatus 100 includes a glass plate 105. During testing, a semiconductor die 110 is disposed on the glass plate 105, and a solder preform 115 disposed on the semiconductor die 110. The apparatus 100 further includes a glass plate 120 disposed on the solder preform 115.

The glass plate 105 and the glass plate 120 may respectively replace a substrate (e.g., fiberglass) and an integrated heat spreader (IHS) (e.g., copper) of a prior apparatus. However, the apparatus 100 has the same or better thermal characteristic (e.g., thermal resistance and/or conductivity)

as the prior apparatus, to ensure that an overshot temperature of a process of manufacturing the solder preform 115 is well-captured when testing the apparatus 100.

Each of the glass plate 105 and the glass plate 120 may be formed of borosilicate glass that is strong enough for the process, e.g., may not be broken or damaged by a force and a temperature used during the process. This transparent material allows a tester (or image recognition system) of the solder preform 115 to directly, visually and/or physically view and check a shape of the solder preform 115 for melting of the solder preform 115, by the naked eye or a microscope. This new process eliminates the need for CSAM, which reduces downtime of other tools in a production line that originally idly waited for the CSAM to be completed, as the visual check of the solder preform 115 may require little to no time. Eliminating the CSAM from the process of manufacturing the solder preform 115 may further reduce human headcount to operate a CSAM system. Also, a unit (e.g., the apparatus 100) for testing the solder preform 115 may be universalized, as all products with the same density can share the same unit, eliminating product specific requirements and saving cost.

The semiconductor die 110 is formed of semiconducting material on which a functional circuit is fabricated.

During testing of the solder preform 115, the glass plate 105 and the glass plate 120 hold the semiconductor die 110 and the solder preform 115. After testing of the solder preform 115, the semiconductor die 110 and the solder preform 115 may be removed from the apparatus 100, and the apparatus 100 may be reused or reassembled with another semiconductor die and another solder preform.

A thermal resistance R (Celsius per watt (C/W)) of an element may be determined using the following equation:

$$R = \frac{L}{k}, L = 0.002 \text{ m}, \tag{1}$$

where L is a thickness (meters (m)) and k is a thermal conductivity (watt per meter-kelvin (w/mk)).

Using Equation (1), a thermal resistance of the substrate of the prior apparatus is $$R_{fiberglass} = \frac{0.002 \text{ m}}{0.04 \frac{W}{mk}} = 0.05 \text{ C/W}.$$

A thermal resistance of the IHS of the privi apparatus is $$R_{Cu} = \frac{0.002 \text{ m}}{398 \frac{W}{mk}} = 5.02e^{-6} \text{ C/W}.$$

A thermal resistance of the glass plate 105 is $$R_{glass} = \frac{0.002 \text{ m}}{1.14 \frac{W}{mk}} = 0.0018 \text{ C/W}.$$

Because the thermal resistance of the substrate (0.05) is greater than the thermal resistance of the glass plate 105 (0.0018), in the apparatus 100, the glass plate 105 can replace the substrate and achieve higher heat transfer.

Assuming a 100 W flow-through being used during a process of manufacturing the apparatus 100, a delta temperature drop (C) at an element may be determined using the following equation:

$$\Delta = R \times Q, \tag{2}$$

where R is a thermal resistance (C/W) and Q is a power (W) that is used during the process.

Using Equation (2), a delta temperature drop at the IHS of the prior apparatus is $$\Delta_{Cu} = 5.02e^{-6} \frac{C}{W} \times 100 \text{ W} = 5.02e^{-4} \text{ C}.$$

A delta temperature drop at the glass plate 120 of FIG. 1A is $$\Delta_{glass} = 0.0018 \frac{C}{W} \times 100 \text{ W} = 0.18 \text{ C}.$$

The delta temperature drop at the glass plate 120 remains small, and does not impact a transient response of the apparatus 100. A main focus is a steady-state temperature being used during the process, which is targeted to be captured to ensure the temperature is within a range, via testing of the solder preform 115. Thus, in the apparatus 100, the glass plate 120 can replace the IHS.

Figure 1B:
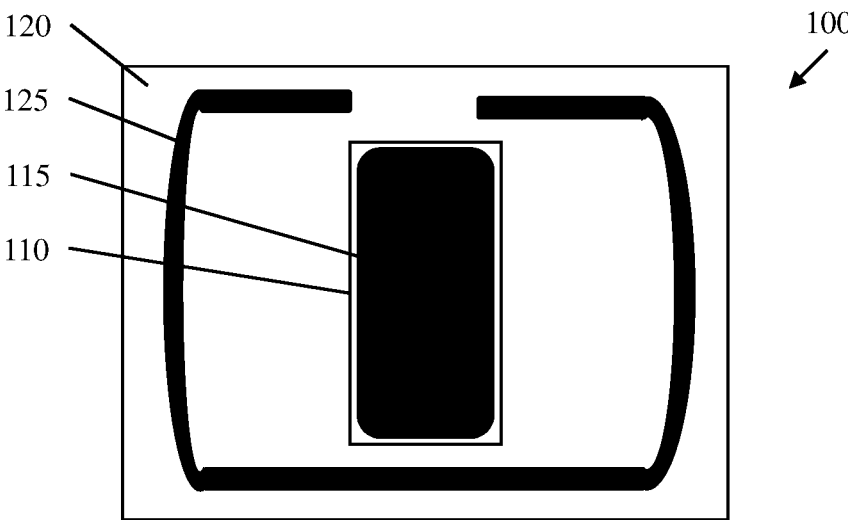
FIG. 1B is a top view of the apparatus of FIG. 1A.

FIG. 1B is a top view of the apparatus 100 of FIG. 1A.

Referring to FIG. 1B, the glass plate 120 is shown. During testing of the solder preform 115, the semiconductor die 110 and the solder preform 115 are disposed at a center of the glass plate 120, and can be seen through the transparent material of the glass plate 120. Any potential melting of the solder preform 115 may be viewed by a tester (or image recognition system) of the solder preform 115 through the transparent material of the glass plate 120.

A sealant 125 may surround the semiconductor die 110 and the solder preform 115, and may be disposed adjacent edges of the glass plate 120. The sealant 125 may be formed of, e.g., super glue or any paste that may withstand a temperature of about 150 degrees Celsius. The sealant 125 may seal the glass plate 120 and the glass plate 105 together.

Figure 2A:
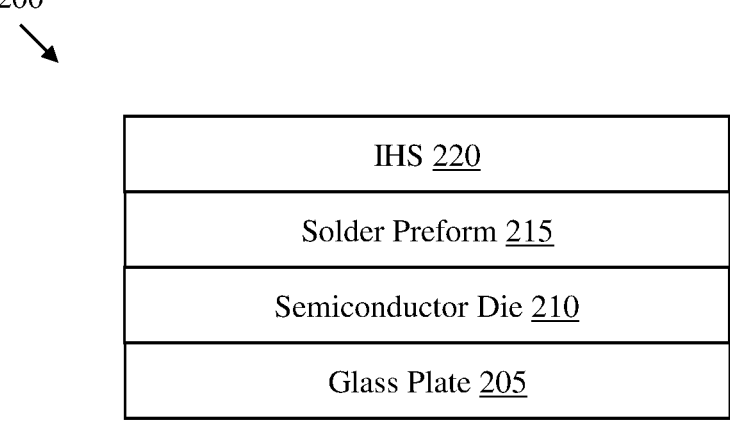
FIG. 2A is a cross-sectional view of an apparatus including transparent material for transparent process performance, according to other aspects of the present disclosure.

FIG. 2A is a cross-sectional view of an apparatus 200 including transparent material for transparent process performance, according to other aspects of the present disclosure.

Referring to FIG. 2A, the apparatus 200 includes a glass plate 205 (e.g., borosilicate glass). During testing, a semiconductor die 210 is disposed on the glass plate 205, and a solder preform 215 is disposed on the semiconductor die 210. The apparatus 200 further includes an IHS 220 (e.g., copper) disposed on the solder preform 215.

The glass plate 205 may replace the substrate of the prior apparatus. The glass plate 205 is transparent and thus allows a tester (or image recognition system) of the solder preform 215 to directly, visually and/or physically view and check a shape of the solder preform 215 for melting of the solder preform 215, by the naked eye or a microscope.

The semiconductor die 210 is formed of semiconducting material on which a functional circuit is fabricated.

The IHS 220 is a metal exterior lid that protects the semiconductor die 210 and the solder preform 215.

During testing of the solder preform 215, the glass plate 205 and the IHS 220 hold the semiconductor die 210 and the solder preform 215. After testing of the solder preform 215, the semiconductor die 210 and the solder preform 215 may be removed from the apparatus 200, and the apparatus 200 may be reused or reassembled with another semiconductor die and another solder preform.

Figure 2B:
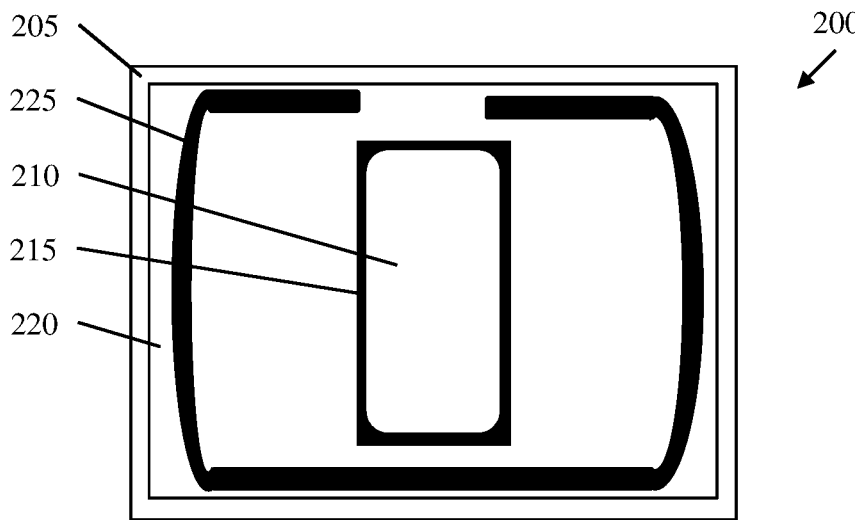
FIG. 2B is a bottom view of the apparatus of FIG. 2A.

FIG. 2B is a bottom view of the apparatus 200 of FIG. 2A.

Referring to FIG. 2B, the glass plate 205 is shown. During testing of the solder preform 215, the semiconductor die 210 and the solder preform 215 are disposed at a center of the glass plate 205, and can be seen through the transparent material of the glass plate 205. Any potential melting of the solder preform 215 may be viewed by a tester (or image recognition system) of the solder preform 215 through transparent material of the glass plate 205.

The IHS 220 may be viewed through the transparent material of the glass plate 205, as being disposed below the solder preform 215.

A sealant 225 may surround the semiconductor die 210 and the solder preform 215, and may be disposed adjacent edges of the glass plate 205. The sealant 125 may be formed of, e.g., super glue or any paste that may withstand a temperature of about 150 degrees Celsius. The sealant 225 may seal the glass plate 205 and the IHS 220 together.

Figure 3:
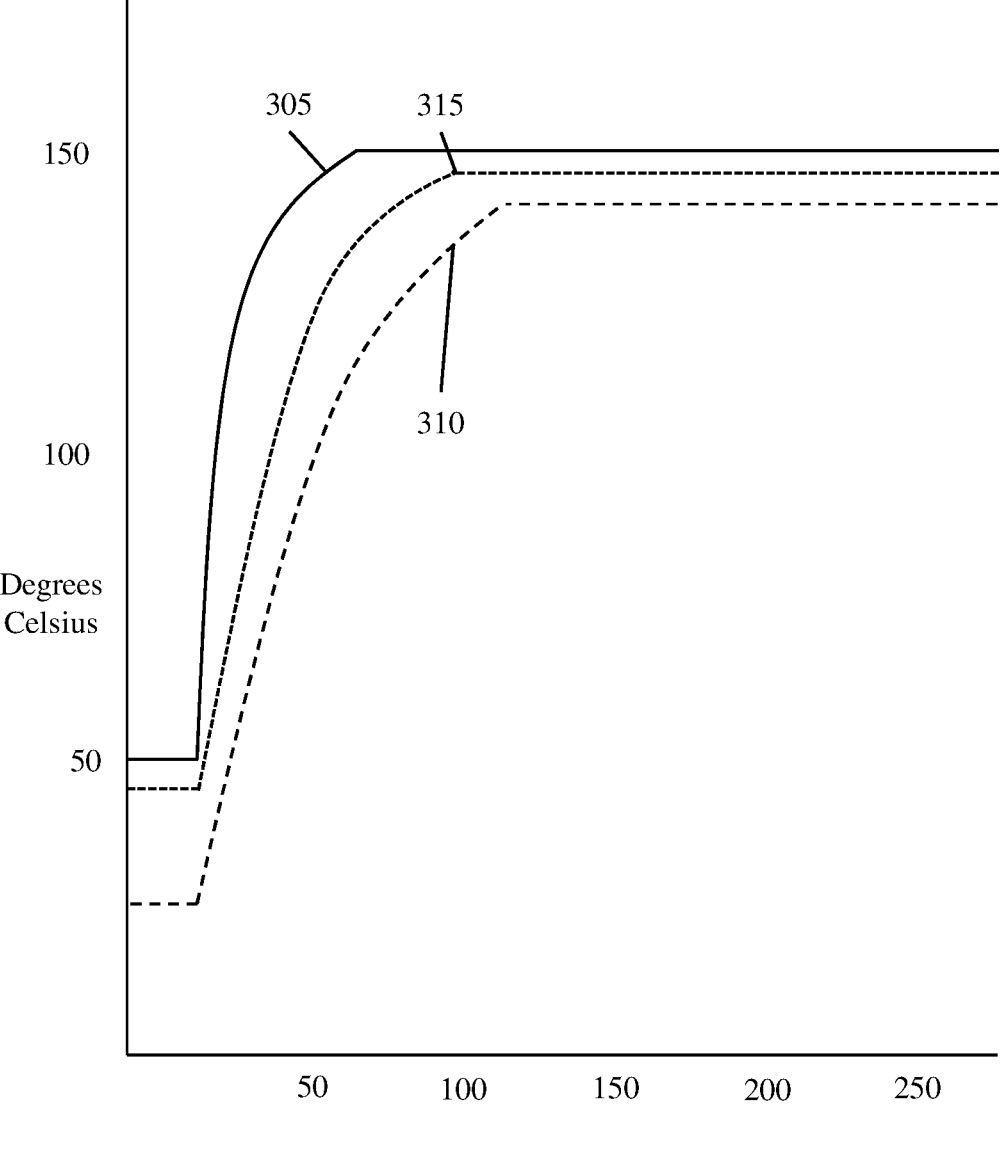
FIG. 3 is a graph of heat transfers measured respectively in a prior apparatus, the apparatus of FIG. 1A and the apparatus of FIG. 2A.

FIG. 3 is a graph of heat transfers 305, 310 and 315 measured respectively in the prior apparatus, the apparatus 100 of FIG. 1A and the apparatus 200 of FIG. 2A.

Referring to FIG. 3, the heater transfers 305, 310 and 315 may be approximately the same in curvature. For example, at a time of about 120 seconds (e.g., an end of a curing cycle), each of the heat transfers 305, 310 and 315 may reach a steady-state temperature of about 150 degrees Celsius. Thus, the glass plate 105 and the glass plate 120 may be used in the apparatus 100 of FIG. 1A, and the glass plate 205 may be used in the apparatus 200 of FIG. 2A.

Figure 4:
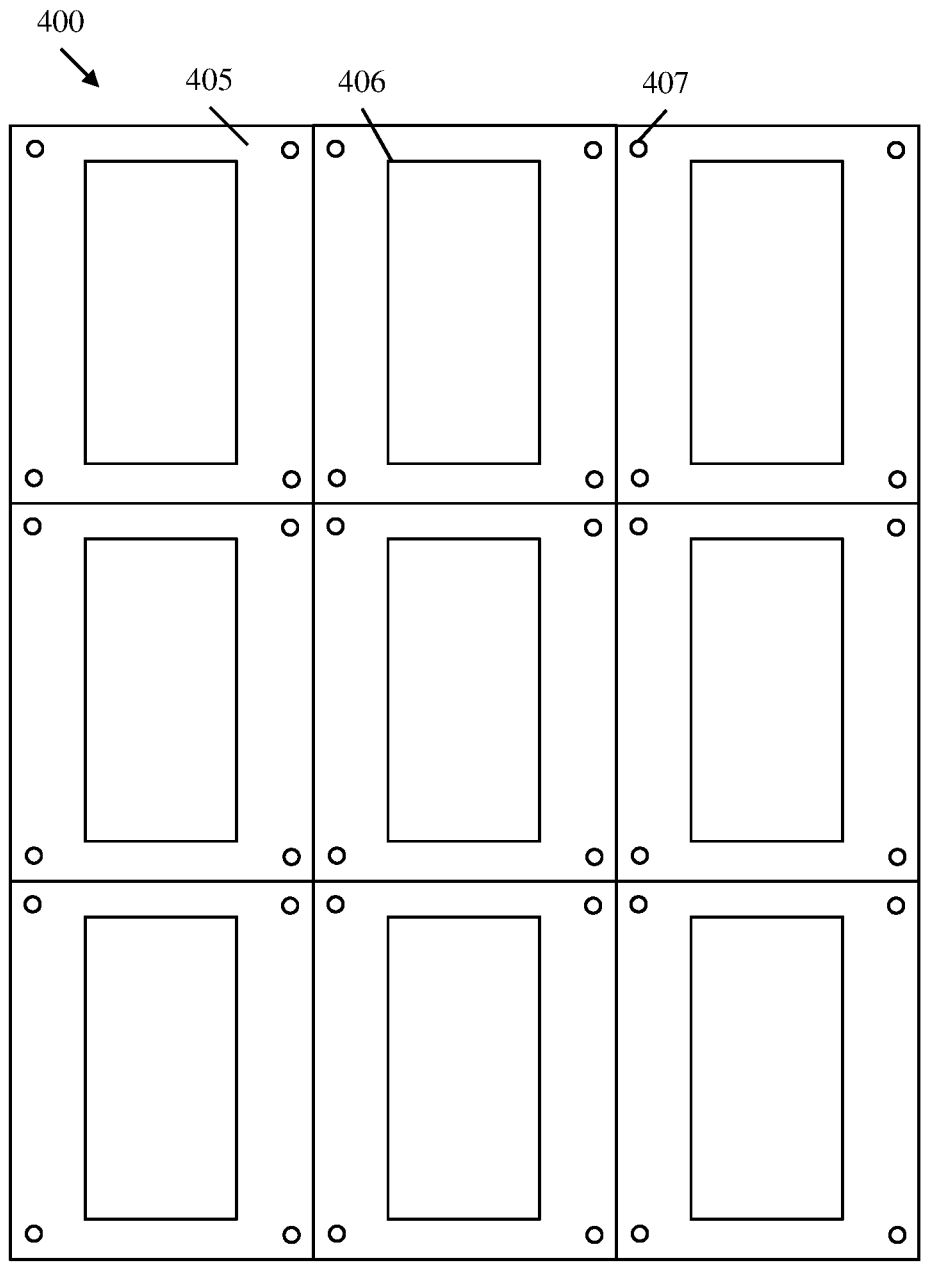
FIG. 4 is a top view of a base tray layer including units, according to aspects of the present disclosure.

FIG. 4 is a top view of a base tray layer 400 including units 405, according to aspects of the present disclosure.

Referring to FIG. 4, the base tray layer 400 may be formed of two outer layers of borosilicate glass. Each of the units 405 includes a pocket 406 (e.g., an intermediate layer) in which, during testing, a semiconductor die is disposed and a solder preform is disposed on the semiconductor die.

Each of the units 405 further includes alignment pins 407 disposed through the two outer layers of borosilicate glass, to align and connect the two outer layers together. The alignment pins 407 may be easier to remove than sealant possibly interposed between the two outer layers of borosilicate glass. Accordingly, the base tray layer 400 may be easier to disassemble and reuse or reassemble with new semiconductor dies and new solder preforms therein.

Although nine units 405 and four alignment pins 407 for each of the units 405 are shown in FIG. 4, this is only an example, and other amounts of the units 405 and the alignment pins 407 may be included in the base tray layer 400.

Figure 5A:
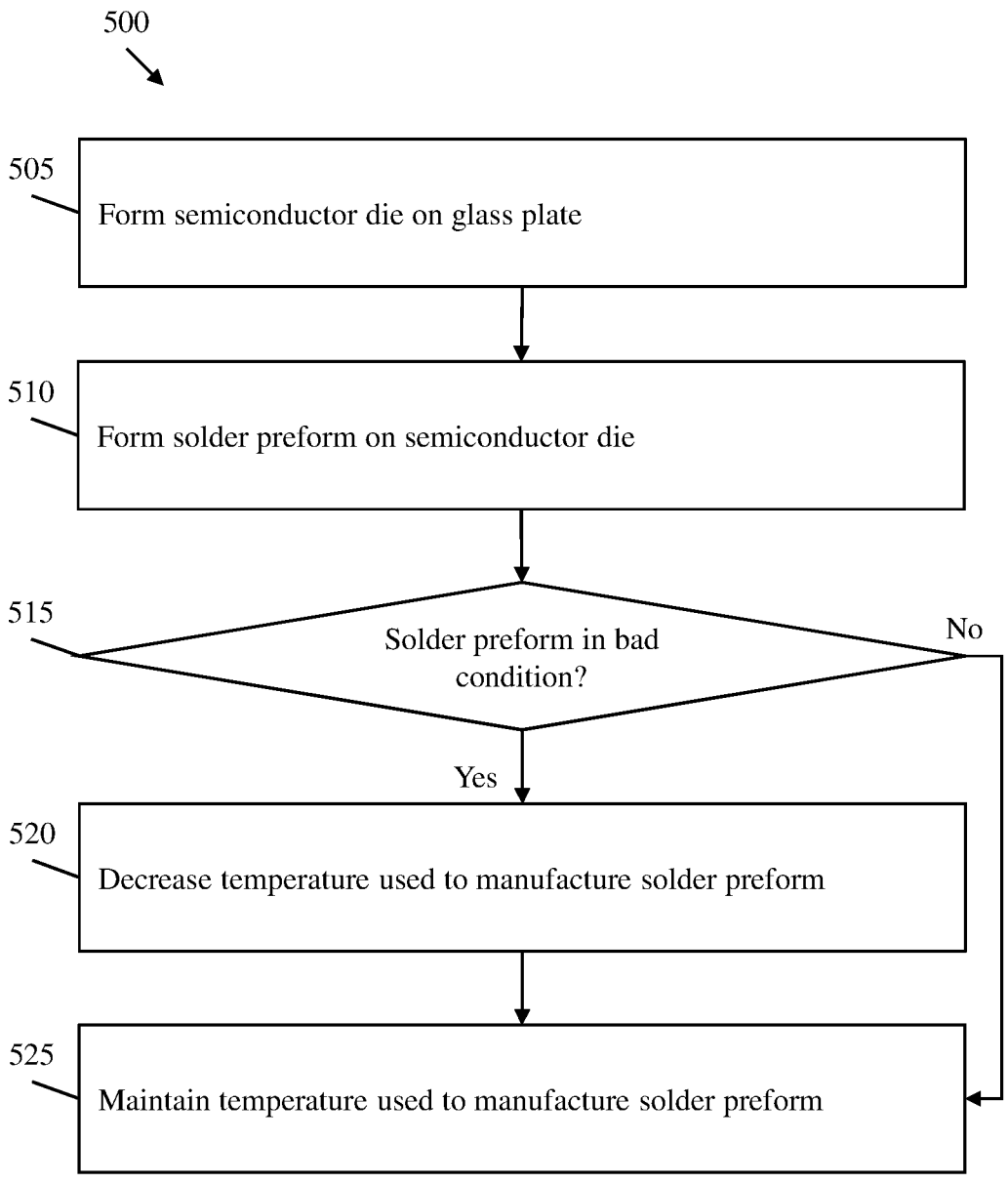
FIG. 5A is a flow diagram of a method of testing a temperature that is used to manufacture a solder preform, using an apparatus, according to aspects of the present disclosure.
Figure 5B:
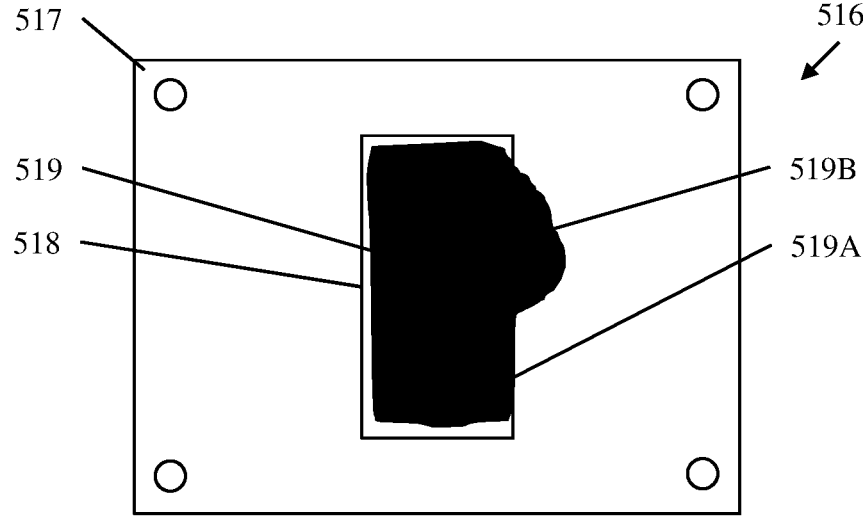
FIG. 5B is a top view of the apparatus of FIG. 5A, in which melting of the solder preform occurs.

FIG. 5A is a flow diagram of a method 500 of testing a temperature that is used to manufacture a solder preform 519, using a testing device 516, according to aspects of the present disclosure. FIG. 5B is a top view of the testing device 516 of FIG. 5A, in which melting of the solder preform 519 occurs.

Referring to FIGS. 5A and 5B, operation 505 may be directed to forming a semiconductor die 518 on a glass plate 517.

Operation 510 may be directed to forming the solder preform 519 on the semiconductor die 518, to form the testing device 516.

Operation 515 may be directed to determining whether the solder preform 519 is in bad condition, e.g., is melted.

For example, the determining whether the solder preform 519 is in the bad condition may include receiving an input from a user or image recognition device that visually analyzes the solder preform 519 viewable through the glass plate 517, and determining whether the solder preform 519 is in the bad condition, based on the received input. Based on the solder preform 519 being determined to be in the bad condition, the method 500 continues in operation 520. Otherwise, the method 500 continues in operation 525.

Referring to FIG. 5B, the testing device 516 includes the glass plate 517. During testing of the solder preform 519, the semiconductor die 518 is disposed on the glass plate 517, and the solder preform 519 is disposed on the semiconductor die 518. The solder preform 519 may be determined to be melted when an edge 519A of the solder preform 519 is uneven or not straight, when solder material 519B of the solder preform 519 leaks past the edge 519A (desired) of the solder preform 519, and/or when the solder preform 519 is not rectangular in shape.

Referring again to FIGS. 5A and 5B, operation 520 may be directed to decreasing the temperature used to manufacture the solder preform 519. The temperature may be decreased by a predetermined temperature value.

Operation 525 may be directed to maintaining the temperature used to manufacture the solder preform 519.

The method 500 may further include forming another glass plate on the solder preform 519. The determining whether the solder preform 519 is in the bad condition may include receiving another input from the user or image recognition device that visually analyzes the solder preform 519 viewable through the other glass plate, and determining whether the solder preform 519 is in the bad condition, based on the received other input.

The method 500 may further include, based on the solder preform 519 being determined to be in the bad condition, replacing the testing device 516 with a new unit.

The methods and sequence of steps presented above are intended to be examples for an apparatus including transparent material for transparent process performance and a method using thereof, according to the present disclosure. It will be apparent to those ordinary skilled practitioners that the foregoing process operations may be modified without departing from the spirit of the present disclosure.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a first glass plate, and an outer layer disposed over the first glass plate. The first glass plate and the outer layer are configured to hold a semiconductor die disposed on the first glass plate, and a solder preform interposed between the semiconductor die and the outer layer. The solder preform is viewable through the first glass plate.

Example 2 may include the apparatus of example 1 and/or any other example disclosed herein, for which the outer layer may include a second glass plate disposed on the solder preform. The solder preform may be viewable through the second glass plate.

Example 3 may include the apparatus of example 2 and/or any other example disclosed herein, further including a sealant interposed between the first glass plate and the second glass plate.

Example 4 may include the apparatus of example 2 and/or any other example disclosed herein, for which each of the first glass plate and the second glass plate may be formed of borosilicate glass.

Example 5 may include the apparatus of example 2 and/or any other example disclosed herein, further including one or more alignment pins disposed through the first glass plate and the second glass plate, and configured to align and connect the first glass plate to the second glass plate.

Example 6 may include the apparatus of example 1 and/or any other example disclosed herein, for which the outer layer may include an integrated heat spreader disposed on the solder preform.

Example 7 may include the apparatus of example 6 and/or any other example disclosed herein, further including a sealant interposed between the first glass plate and the integrated heat spreader.

Example 8 may include the apparatus of example 1 and/or any other example disclosed herein, for which the first glass plate may be formed of borosilicate glass.

Example 9 provides a method including forming a semiconductor die on a first glass plate, and forming a solder preform on the semiconductor die, to form a testing device. The method further includes determining whether the solder preform is melted, based on an input from a user or an image recognition device that visually analyzes the solder preform viewable through the first glass plate, and based on the solder preform being determined to be melted, decreasing a temperature that is used to form the solder preform.

Example 10 may include the method of example 9 and/or any other example disclosed herein, for which the solder preform may be determined to be melted based on an edge of the solder preform not being straight and/or based on the solder preform not being rectangular in shape.

Example 11 may include the method of example 9 and/or any other example disclosed herein, further including, based on the solder preform being determined to not be melted, maintaining the temperature used to form the solder preform.

Example 12 may include the method of example 9 and/or any other example disclosed herein, further including forming a second glass plate on the solder preform, to form the testing device.

Example 13 may include the method of example 12 and/or any other example disclosed herein, for which the determining whether the solder preform is melted may include determining whether the solder preform is melted, based on an input from the user or the image recognition device that visually analyzes the solder preform viewable through the second glass plate.

Example 14 may include the method of example 9 and/or any other example disclosed herein, further including, based on the solder preform being determined to be melted, replacing the formed testing device with a new testing device.

Example 15 provides non-transitory computer-readable medium including instructions, which, if executed by a processor, cause the processor to control a semiconductor fabrication device to form a semiconductor die on a first glass plate, and control the semiconductor fabrication device to form a solder preform on the semiconductor die, to form a testing device. The instructions, which, if executed by the processor, further cause the processor to determine whether the solder preform is melted, based on an input from a user or an image recognition device that visually analyzes the solder preform viewable through the first glass plate, and based on the solder preform being determined to be melted, decrease a temperature that is used to form the solder preform.

Example 16 may include the non-transitory computer-readable medium of example 15 and/or any other example disclosed herein, for which the solder preform may be determined to be melted based on an edge of the solder preform not being straight and/or based on the solder preform not being rectangular in shape.

Example 17 may include the non-transitory computer-readable medium of example 15 and/or any other example disclosed herein, for which the instructions, which, if executed by the processor, may further cause the processor to, based on the solder preform being determined to not be melted, maintain the temperature used to form the solder preform.

Example 18 may include the non-transitory computer-readable medium of example 15 and/or any other example disclosed herein, for which the instructions, which, if executed by the processor, may further cause the processor to control the semiconductor fabrication device to form a second glass plate on the solder preform, to form the testing device.

Example 19 may include the non-transitory computer-readable medium of example 18 and/or any other example disclosed herein, for which the instructions, which, if executed by the processor, may further cause the processor to determine whether the solder preform is melted, based on an input from the user or the image recognition device that visually analyzes the solder preform viewable through the second glass plate.

Example 20 may include the non-transitory computer-readable medium of example 15 and/or any other example disclosed herein, for which the instructions, which, if executed by the processor, may further cause the processor to, based on the solder preform being determined to be melted, control the semiconductor fabrication device to replace the formed testing device with a new testing device.

Example 21 provides an apparatus including first forming means for forming a semiconductor die on a first glass plate, and second forming means for forming a solder preform on the semiconductor die, to form a testing device. The apparatus further includes determining means for determining whether the solder preform is melted, based on an input from a user or an image recognition device that visually analyzes the solder preform viewable through the first glass plate, and decreasing means for, based on the solder preform being determined to be melted, decreasing a temperature that is used to form the solder preform.

Example 22 may include the apparatus of example 21 and/or any other example disclosed herein, for which the solder preform may be determined to be melted based on an edge of the solder preform not being straight and/or based on the solder preform not being rectangular in shape.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
a first glass plate; and
an outer layer disposed over the first glass plate,
wherein the first glass plate and the outer layer are configured to removably hold a semiconductor die comprising a first surface, with a solder preform disposed thereon, and a second surface that is disposed on the first glass plate, and
wherein the solder preform is interposed between the semiconductor die and the outer layer,
wherein the solder preform is viewable through the first glass plate,
wherein the outer layer comprises a second glass plate disposed on the solder preform, and
wherein the solder preform is viewable through the second glass plate.

2. The apparatus of claim 1, further comprising a sealant interposed between the first glass plate and the second glass plate.

3. The apparatus of claim 1, wherein each of the first glass plate and the second glass plate is formed of borosilicate glass.

4. The apparatus of claim 1, further comprising one or more alignment pins disposed through the first glass plate and the second glass plate, and configured to align and connect the first glass plate to the second glass plate.

5. The apparatus of claim 1, wherein the outer layer comprises an integrated heat spreader disposed on the solder preform.

6. The apparatus of claim 5, further comprising a sealant interposed between the first glass plate and the integrated heat spreader.

7. The apparatus of claim 1, wherein the first glass plate is formed of borosilicate glass.

8. A method comprising:
forming a semiconductor die on a first glass plate,
wherein an outer layer is disposed over the first glass plate;
forming a solder preform on the semiconductor die, to form a testing device;
determining whether the solder preform is melted, based on an input from a user or an image recognition device that visually analyzes the solder preform viewable through the first glass plate,
wherein the outer layer comprises a second glass plate disposed on the solder preform, and
wherein the solder preform is viewable through the second glass plate; and
based on the solder preform being determined to be melted, decreasing a temperature that is used to form the solder preform.

9. The method of claim 8, wherein the solder preform is determined to be melted based on an edge of the solder preform not being straight and/or based on the solder preform not being rectangular in shape.

10. The method of claim 8, further comprising, based on the solder preform being determined to not be melted, maintaining the temperature used to form the solder preform.

11. The method of claim 8, further comprising forming the second glass plate on the solder preform, to form the testing device.

12. The method of claim 11, wherein the determining whether the solder preform is melted comprises determining whether the solder preform is melted, based on an input from the user or the image recognition device that visually analyzes the solder preform viewable through the second glass plate.

13. The method of claim 8, further comprising, based on the solder preform being determined to be melted, replacing the formed testing device with a new testing device.

14. A non-transitory computer-readable medium comprising instructions, which, if executed by a processor, cause the processor to:
control a semiconductor fabrication device to form a semiconductor die on a first glass plate,
wherein an outer layer is disposed over the first glass plate;
control the semiconductor fabrication device to form a solder preform with a first shape on the semiconductor die, to form a testing device;
determine whether the solder preform is melted to form a second shape, based on an input from a user or an image recognition device that visually analyzes the solder preform viewable through the first glass plate,
wherein the outer layer comprises a second glass plate disposed on the solder preform, and
wherein the solder preform is viewable through the second glass plate; and
based on the solder preform being determined to be melted, decrease a temperature that is used to form the solder preform.

15. The non-transitory computer-readable medium of claim 14, wherein the solder preform is determined to be melted based on the second shape having an edge not straight and/or based on the solder preform not being rectangular in shape.

16. The non-transitory computer-readable medium of claim 14, wherein the instructions, which, if executed by the processor, further cause the processor to, based on the solder preform being determined to not be melted, maintain the temperature used to form the solder preform.

17. The non-transitory computer-readable medium of claim 14, wherein the instructions, which, if executed by the processor, further cause the processor to control the semiconductor fabrication device to form the second glass plate on the solder preform, to form the testing device.

18. The non-transitory computer-readable medium of claim 17, wherein the instructions, which, if executed by the processor, further cause the processor to determine whether the solder preform is melted, based on an input from the user or the image recognition device that visually analyzes the solder preform viewable through the second glass plate.

19. The non-transitory computer-readable medium of claim 14, wherein the instructions, which, if executed by the processor, further cause the processor to, based on the solder preform being determined to be melted, control the semiconductor fabrication device to replace the formed testing device with a new testing device.

20. The non-transitory computer-readable medium of claim 14, wherein each of the first glass plate and the second glass plate is formed of borosilicate glass.

* * * * *